US008890733B2

(12) United States Patent
Yamamoto et al.

(10) Patent No.: US 8,890,733 B2
(45) Date of Patent: Nov. 18, 2014

(54) DEVICE, SYSTEM AND METHOD FOR ANALOGUE-TO-DIGITAL CONVERSION USING A CURRENT INTEGRATING CIRCUIT

(71) Applicants: IMEC, Leuven (BE); Renesas Electronics Corporation, Kanagawa (JP)

(72) Inventors: Takaya Yamamoto, Gunma-ken (JP); Jan Craninckx, Boutersem (BE)

(73) Assignees: IMEC, Leuven (BE); Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/768,811

(22) Filed: Feb. 15, 2013

(65) Prior Publication Data

US 2013/0214947 A1 Aug. 22, 2013

(30) Foreign Application Priority Data

Feb. 17, 2012 (EP) ..................................... 12156093

(51) Int. Cl.
| | |
|---|---|
| H03M 1/12 | (2006.01) |
| G11C 27/02 | (2006.01) |
| H03M 1/38 | (2006.01) |
| H03M 1/08 | (2006.01) |
| H03M 1/46 | (2006.01) |

(52) U.S. Cl.
CPC .............. *H03M 1/38* (2013.01); *H03M 1/0854* (2013.01); *H03M 1/129* (2013.01); *H03M 1/46* (2013.01); *G11C 27/024* (2013.01)
USPC ............................................. 341/123; 327/91

(58) Field of Classification Search
CPC ...... H03M 1/24; H03M 1/1245; G11C 27/02; G11C 27/024; G11C 27/026; G11C 27/028
USPC ........................ 341/122, 123, 155; 327/91, 94
See application file for complete search history.

(56) References Cited

U.S. PATENT DOCUMENTS

| | | | | |
|---|---|---|---|---|
| 6,307,497 | B1 * | 10/2001 | Leung et al. ................... | 341/155 |
| 6,608,583 | B1 * | 8/2003 | Konno .......................... | 341/155 |
| 7,385,427 | B2 * | 6/2008 | Lim .............................. | 327/92 |
| 8,283,948 | B2 * | 10/2012 | Shrivastava .................... | 327/95 |

FOREIGN PATENT DOCUMENTS

| | | |
|---|---|---|
| EP | 0218326 A2 | 4/1987 |
| WO | WO2008/006751 A1 | 1/2008 |

OTHER PUBLICATIONS

European Search Report, European Patent Application No. 12156093.2 dated Aug. 22, 2012.
Carley, Ricard L. et al., "High-Speed Low-Power Integrating CMOS Sample-and-Hold Amplifier Architecture", IEEE 1995 Custom Integrated Circuits Conference, Jan. 5, 1995, pp. 543-546.
Ranganathan, Sanjeev, "Discrete-Time Parametric Amplification Based on a Three-Terminal MOS Varactor: Analysis and Experimental Results", IEEE Journal of Solid-State Circuits, vol. 38, No. 12, Dec. 2003, pp. 2087-2093.
Oliveira, J.P., "Low-Power CMOS Comparator with Embedded Amplification for Ultra-high-speed ADCs", 2007 IEEE, pp. 3602-3605.

* cited by examiner

*Primary Examiner* — Howard Williams
(74) *Attorney, Agent, or Firm* — McDonnell Boehnen Hulbert & Berghoff LLP

(57) ABSTRACT

A device including a sample and hold circuit for providing a signal related to an input analogue current signal, by sampling the input analogue current signal and integrating it on capacitive means, thereby charging the capacitive means to a charge value. The capacitive means being configurable to dynamically change its effective capacitance value in order to shape a voltage signal present on the capacitive means such that the charge value remains unchanged. The device also including an analogue-to digital conversion (ADC) and control circuit arranged for performing an ADC of the at least one related signal at the output of the sample and hold circuit into an output digital signal, the ADC and control circuit including successive approximation ADC means for considering the value of the voltage signal on the capacitive means and converting the charge value present in the capacitive means into the digital output signal.

14 Claims, 6 Drawing Sheets

DEVICE, SYSTEM AND METHOD FOR ANALOGUE-TO-DIGITAL CONVERSION USING A CURRENT INTEGRATING CIRCUIT

CROSS-REFERENCE TO RELATED APPLICATION

This application claims priority to European Patent Application No. 12156093.2 filed on Feb. 17, 2012, the contents of which are hereby incorporated by reference.

TECHNICAL FIELD

The present disclosure relates to analogue-to-digital conversion, and more specifically to a device, a system, and method for analogue-to-digital conversion using a current integrating circuit.

DESCRIPTION OF RELATED TECHNOLOGY

Driven by the increasing demand of new-generation products and high-performance applications that require signal processing at ever-lower power usage, analogue-to-digital converters (ADCs) have become an important factor for optimizing the overall system power budget of an electronic device.

As sampling rates become higher, the power consumption required to adapt the ADC input stage characteristics for the required conversion performance, becomes, in some cases, significantly higher than the power required by the analogue-to-digital conversion mechanism itself. There is therefore a desire to consider the power consumption also at the ADC input stage.

A known power efficient technique for reducing the power consumption of a system circuit input stage is to use a current interface circuit between a voltage input signal ($V_{in}$) and a sample and hold (S/H) circuit. An example of such current integrating S/H architecture is disclosed in L. Carley and T. Mukherjee, "High-speed Low-Power Integrating CMOS Sample-and-Hold Amplifier Architecture", *IEEE Custom integrated Circuits conference*, pp. 543-546, 1995. These teachings could be applied, for example, to reduce the power consumption of the input stage of a system performing analogue-to-digital conversion.

A problem for applying such current-mode techniques to present ADC systems, however, is the non-linearity characteristics of such input stages. As a result of a nonlinear change in the voltage-to-current conversion gain, the sampled signal will not be linearly related to the input voltage and therefore the ADC will suffer from harmonic distortion.

Additionally, generally known solutions to make such current-mode input stages linear, will require, on the other hand, high power consumption.

SUMMARY

Generally, the present disclosure provides an improved device, system, and/or method for analogue-to-digital conversion that makes use of a current integrating circuit and requires low power consumption.

According to a first aspect of the disclosure, there is provided a device for converting an input analogue current signal into an output digital signal. The device includes a sample and hold circuit for providing a sample of at least one signal related to the input analogue current signal and an analogue-to-digital conversion and control circuit for performing an analogue-to-digital conversion of the at least one related signal at the output of the sample and hold module into the output digital signal. The sample and hold circuit is adapted for sampling the analogue current signal and integrating it on capacitive means that is configurable to dynamically change its effective capacitance value in order to shape a voltage signal present on the capacitive means. The analogue-to-digital conversion and control circuit includes successive approximation analogue-to-digital conversion means for considering the value of the voltage signal on the capacitive means and converting a charge value present in the variable capacitive means into the digital output signal.

The device for analogue-to-digital conversion according to an embodiment of the disclosure is able to make use of a current integrating stage without being affected by the non-linear characteristics and the signal restriction imposed by voltage-to-current converters, reduces analogue-to-digital conversion power consumption, increases immunity to charge-mode conversion noise, and offers a wide signal dynamic range. The system according to an embodiment of the disclosure also avoids the need to use very linear capacitive means, as is the case in voltage-mode analogue-to-digital converters.

The device for analogue-to-digital conversion according to an embodiment of the presented disclosure relies on the fact that an SAR ADC circuit following an S/H circuit operates in the charge domain, and hence an accurate linear sampled voltage at the output of the S/H circuit is not necessary. While known voltage-based SAR ADC designs need a very linear capacitor to linearly transfer the input voltage into a sampled charge to be processed for conversion, the present disclosure avoids such constraint by converting the charge present in the S/H capacitive means, which is linearly generated by integrating the input current to the S/H circuit. Therefore, based on the fact that the device according to the disclosure just needs an accurately sampled charge available in the S/H capacitive means, the device can use a nonlinear capacitor to maintain that charge.

Additionally, since the successive approximation conversion steps performed in the analogue-to-digital conversion and control circuit are based on passive charge-sharing techniques, in which a comparator recognizes only the signs of the corresponding differential voltage, the differential voltage doesn't have to be precisely linear and the voltage input to the comparator can be shaped in form in order to increase immunity to noise.

According to another aspect of the disclosure, the effective capacitance value of the capacitive means is configurable to at least a first value during a first period in which the analogue current signal is being integrated in the sample and hold circuit, and configurable to at least a second value during a second period in which the charge value present in the capacitive means is being converted by the analogue-to-digital conversion and control circuit into the output digital signal. In one example, the first value is higher than the second value.

According to still another embodiment of the disclosure the capacitive means includes at least two capacitors configurable so that during the second period, the first capacitor is configurable from a high to a low capacitance value while a certain bit of the output digital signal is determined, and the second capacitor is configurable from a high to a low capacitance value, after the first capacitor has been configured to low capacity and when a subsequent bit of the output digital signal is determined.

According to still another embodiment, the variable capacitive means can be implemented using at least one voltage dependent capacitor, including a MOS capacitor, for example. The capacitive means may be implemented by means of one or a plurality of non-linear MOS capacitors, both NMOS and/or PMOS. In still another embodiment of the disclosure, at least a pair of both NMOS and PMOS capacitors is used.

The disclosure also relates to a system for converting an input analogue voltage signal into an output digital signal, to an integrated circuit, to a method for converting an analogue current signal into a digital signal, and to a method for converting an analogue voltage signal into a digital signal.

Certain objects and advantages of various inventive aspects have been described above. It is to be understood that not necessarily all such objects or advantages may be achieved in accordance with any particular embodiment of the disclosure. Those skilled in the art will recognize that the disclosure may be embodied or carried out in a manner that achieves or optimizes one advantage or group of advantages without necessarily achieving other objects or advantages as may be taught or suggested herein. Further embodiments, features, and advantages of the present disclosure may be described in detail below with reference to the accompanying drawings.

BRIEF DESCRIPTION OF THE DRAWINGS

The accompanying drawings illustrate one or more example embodiments of the present disclosure and, together with the description, further serve to explain the principles of the disclosure and to enable a persona skilled in the art to make and use the disclosure.

DETAILED DESCRIPTION

In the following, it should be appreciated that in the description of example embodiments of the disclosure various features of the disclosure are sometimes grouped together in a single embodiment, figure, or description thereof for the purpose of streamlining the disclosure and aiding in the understanding of one or more of the various inventive aspects. This is however not to be interpreted as the disclosure requiring more features than the ones expressly recited in each claim, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those skilled in the art.

In the description of the embodiments, numerous specific details are set forth. However, it is understood that embodiments of the disclosure may be practiced without these non-essential specific details. In other instances, well-known methods, structures, and techniques have not been shown in detail in order not to obscure an understanding of this description.

Figure 1A:
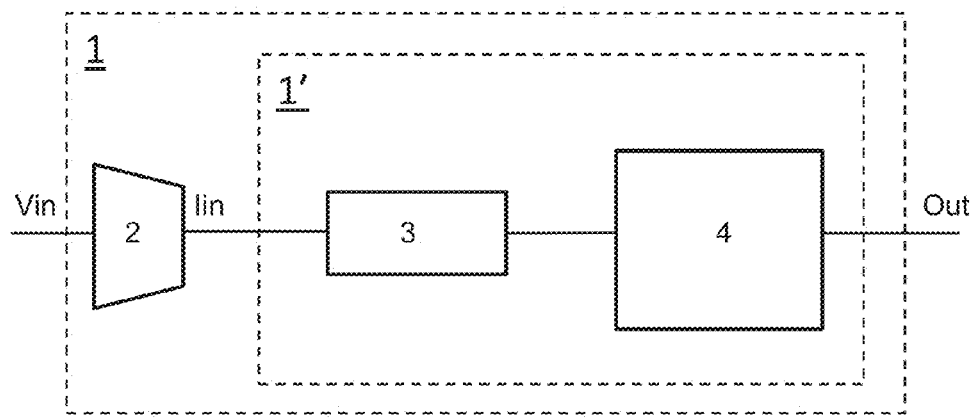
FIG. 1A shows a general block diagram of an example embodiment of a system for analogue-to-digital conversion according to the present disclosure.

FIG. 1A shows a block diagram of a system 1 for converting an input analogue voltage signal Vin into an output digital signal Out of N bits, the system comprising an input interface circuit 2, a sample and hold circuit 3 and an analogue-to-digital conversion and control circuit 4.

The input interface circuit 2 is adapted to receive the input analogue voltage signal Vin and includes voltage-to-current conversion means for converting it into an analogue current signal Iin. The analogue current signal Iin is related to that input analogue voltage signal Vin in the sense that at least one of its characteristics conveys information about the voltage value of the input voltage analogue signal Vin. The voltage-to-current (V/I) conversion means could be implemented for example by one or a plurality of trans-conductors and/or variable-gain trans-conductor cells.

Figure 1B:
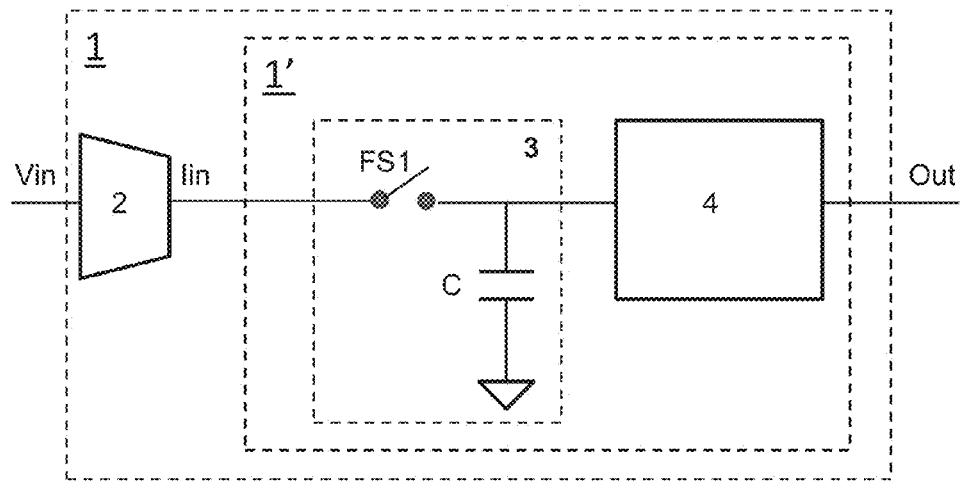
FIG. 1B illustrates a general block diagram of an example embodiment of a system for analogue-to-digital conversion according to the present disclosure.

The sample and hold circuit 3 is adapted for receiving and integrating the analogue current signal Iin provided by the input interface circuit 2. A schematic and general representation of the sample and hold circuit 3 can be seen in FIG. 1B, basically comprising sampling means FS1 and capacitive means C.

According to the disclosure, the input analogue current signal Iin is converted, in the sample and hold circuit 3, to a charge that is stored in its capacitive means, by integrating that current during a certain time interval on that capacitive means.

The analogue-to-digital conversion and control circuit 4 comprises successive approximation (SA) conversion means for converting the charge stored in the capacitive means of the S/H circuit 3 into the output N-bit digital signal Out. The SA conversion steps are based on passive charge-sharing using basically a DAC and a comparator and in which a comparator recognizes the sign of a corresponding differential voltage. A general description on how such SA conversion is performed in the charge-domain can be found in international patent application WO 2008/00675.

It shall be understood that although the described system 1 according to an embodiment of the disclosure combines the functionality of an input interface circuit 2, a sample and hold circuit 3, and an analogue-to-digital conversion and control circuit 4, such functionality may be implemented also combining a plurality of independent interconnected devices, each performing one or more functionalities corresponding to the ones disclosed in the present disclosure. For example, a first device or circuit may be used for performing the V/I conversion function and a second device 1' may perform the functionality of the sample and hold circuit 3 and the analogue-to-digital SAR conversion and control circuit 4.

Figure 2A:
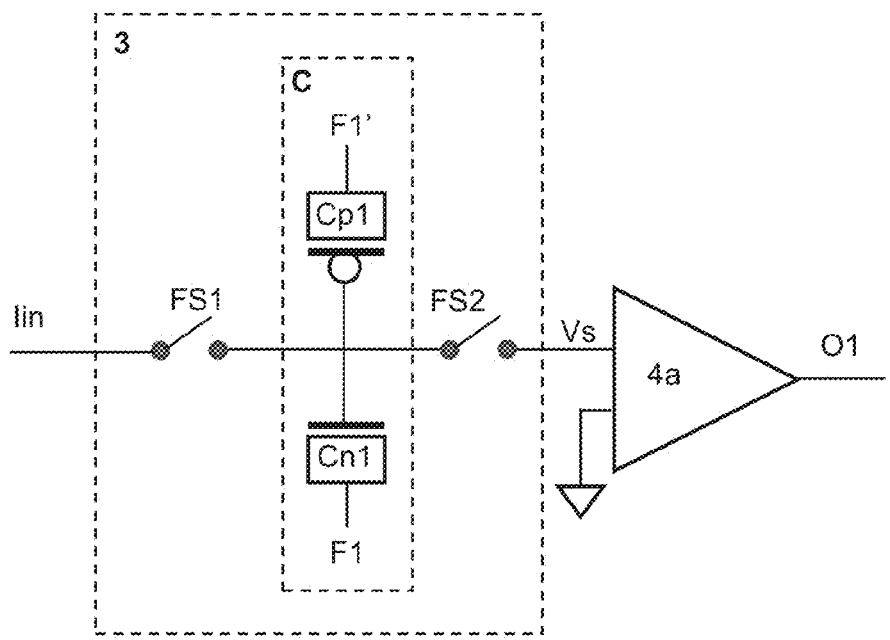
FIG. 2A is a schematic diagram of an example embodiment of a sample and hold circuit according to the present disclosure.

FIG. 2A is a schematic diagram of an example embodiment of a sample and hold circuit 3, which is connected to a comparator 4a providing an output O1 indicative of the difference between a S/H voltage signal Vs and a reference voltage. S/H circuit first sampling means FS1 is controlled such that the S/H circuit obtains a sample of the analogue current signal Iin during a certain time interval and second sampling means FS2 is controlled such that a sample of the S/H voltage signal Vs, on the capacitive means C, is provided to the comparator 4a of the analogue-to-digital conversion and control circuit 4 during another time interval.

According to an embodiment of the disclosure, the capacitive means C of the sample and hold circuit 3 is implemented by voltage dependent capacitors, such as MOS capacitors. For an analogue-to-digital system using differential voltage signals according to an embodiment of the disclosure, MOS capacitor pairs comprising an NMOS and a PMOs capacitor can be beneficial. In FIG. 2A, a MOS capacitor pair including an NMOS Cn1 capacitor and a PMOS Cp1 capacitor, is operated by MOS capacitor control signals F1, F1', respectively, so that the effective capacitance value CVA, CVB can be dynamically changed during system operation, as is shown in FIG. 2B.

According to an embodiment of the disclosure a MOS capacitor Cn1, Cp1 is operated so that its effective capacitance value is set to a first value CVA during a first period P1 in which the analogue current signal Iin is integrated in the sample and hold circuit 3, and set to a second value CVB during a second period P2 in which the analogue-to-digital conversion and control circuit 4 converts the charge stored in the pair of MOS capacitors Cn1, Cp1 into the digital output signal Out.

Generally expressed, the effective capacitance value of the capacitive means C is increased during the current integration period or sampling phase and decreased during the conversion period or charge-sharing SAR phase. For example, a large but very nonlinear MOS capacitor presenting an effective capacitance value of 23 pF in inversion mode can be used during the integration period, and afterwards, during the conversion period, the biasing of MOS capacitors is changed to depletion mode so that the effective capacitance value becomes 8 pF.

Figure 2B:
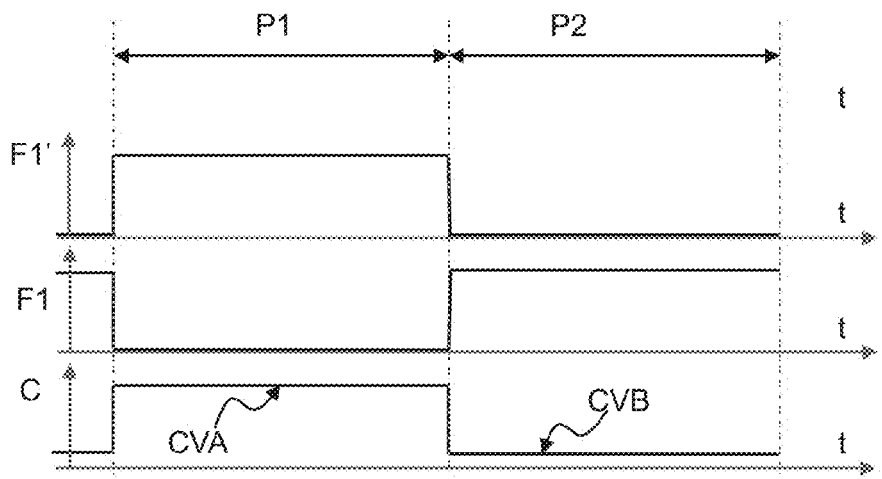
FIG. 2B illustrates a timing diagram corresponding to an example operation of a capacitive means of the sample and hold circuit of FIG. 2A.
Figure 3:
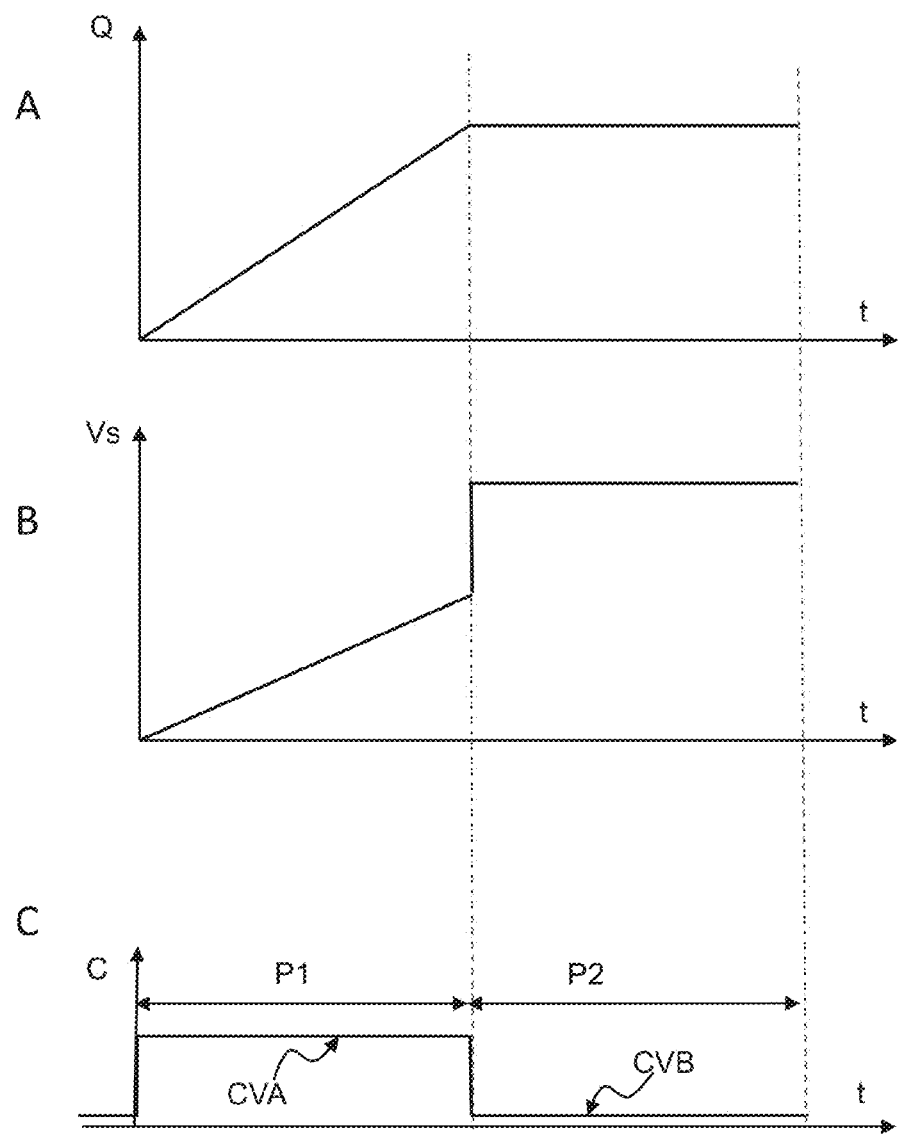
FIG. 3A is a graph representing the value of the charge stored in the capacitive means of the sample and hold circuit of FIG. 2A.
FIG. 3B is a graph representing the value of a voltage present at the input of the comparator means of FIG. 2A.
FIG. 3C is a graph representing the capacitance value of the capacitive means of the sample and hold circuit of FIG. 2A.

FIGS. 3A and 3B illustrate, respectively, a graph of the value of the charge Q stored in the capacitive means C and the value of the S/H voltage signal Vs on the capacitive means C of FIG. 2A, corresponding to the effective capacitance value of the capacitive means C as shown in FIGS. 2B and 3C.

During the current integration period P1, the MOS capacitor Cn1, Cp1 is biased in order to achieve a high first capacitance value CVA, for example equal or higher than 20 pF, which reduces the voltage swing on the MOS capacitor, enables a substantially linear voltage-to-current conversion in the input interface circuit 2, and ensures sufficient linearity for the charge conversion.

During the conversion period P2, the charge domain analogue-to digital conversion and control circuit 4 requires larger differential voltages at the input of the comparator 4a to avoid performance degradation due to comparator noise, since small voltages result in bad signal-to-noise ratio. Therefore, the operating point of the MOS capacitor is moved to its low-capacitance region and set to a low second capacitance value CVB, for example, equal or lower than 8 pF, such that the S/H voltage signal Vs is passively amplified but the sampled charge Q is preserved on the MOS capacitor.

Although the voltage gain obtained by this passive amplification is very nonlinear, the amount of charge Q sampled on the MOS capacitor does not change, and hence the charge domain analogue-to digital conversion and control circuit 4 can perform a linear digitization of that charge.

The ratio between the two effective capacitance values CVA, CVB is determined by the aspect ratio of the MOS capacitors and a trade-off exists between the capacitance ratio and the speed of the passive amplification. If for example, the first capacitance value CVA is designed around 20 pF and the second capacitance value CVB around 5 pF, we obtain amplification around a factor of 4.

Figure 4A:
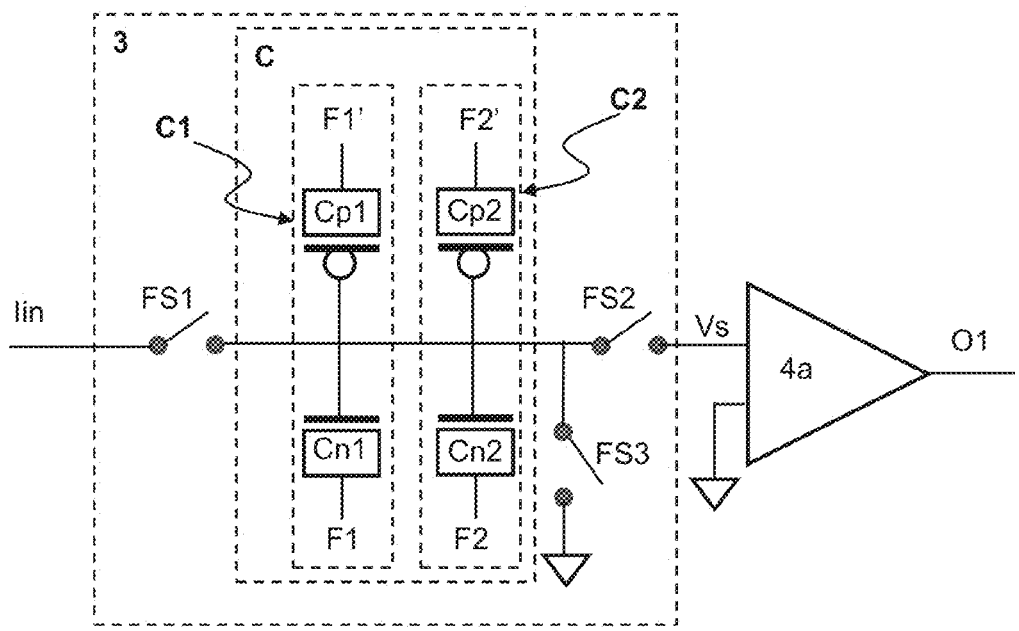
FIG. 4A is a schematic diagram of an example embodiment of a sample and hold circuit according to the present disclosure.
Figure 4B:
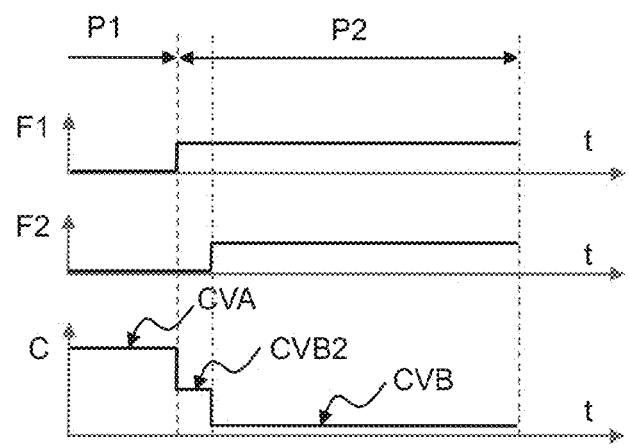
FIG. 4B illustrates a timing diagram corresponding to an example operation of the capacitive means of the sample and hold circuit of FIG. 4A.

FIG. 4A is a schematic diagram of another example embodiment of a sample and hold circuit 3 comprising two capacitors C1, C2 implemented as MOS capacitor pairs. The first capacitor C1 is a first MOS capacitor pair including a first NMOS Cn1 and a PMOS Cp1 capacitor and the second capacitor C2 is a second MOS capacitor pair including a second NMOS Cn2 and a PMOS Cp2 capacitor. The MOS capacitor pairs are operated by MOS capacitor control signals F1, F1' and F2, F2' respectively so that the effective capacitance values CVA, CVB2, CVB can be dynamically changed during system operation, as is shown in FIG. 4B. MOS capacitor control signal F1' is the inverse of control signal F1 and MOS capacitor control signal F2' is the inverse of control signal F2.

In this case, according to an embodiment of the disclosure, right after the conversion period P2 starts and before the most significant bit of the output digital signal Out is determined, MOS capacitor control signal F1 rises and causes the first pair of MOS capacitors Cn1, Cp1 to become biased to low capacitance value, so that the effective capacitance value of the capacitive means C is reduced to a certain value CVB2, and, after the most significant bit of the output digital signal Out is determined, MOS capacitor control signal F2 rises and causes the second pair of MOS capacitors Cn2, Cp2 to become biased to low capacitance value, so that the effective capacitance value of the capacitive means C is further reduced to a low value CVB.

The reason of using this 2-step passive amplification is to keep comparator input voltages within a certain voltage range. This way of reducing the effective capacitance value of the capacitive means C in a stepwise manner according to an embodiment of the disclosure increases immunity to system charge leakage.

It shall be understood that biasing first capacitor C1 to low capacitance value during a certain output digital signal bit determination step and biasing the second capacitor C2 to low capacitance value during a subsequent output digital signal bit determination step is also possible according to another embodiment of the disclosure, so that the above disclosed 2-step passive amplification technique can be applied at any output digital signal bit determination step.

FIG. 4A also shows a switch FS3 which may be used to reset the capacitive means C before sampling the next input analogue current signal Iin.

Figure 5A:
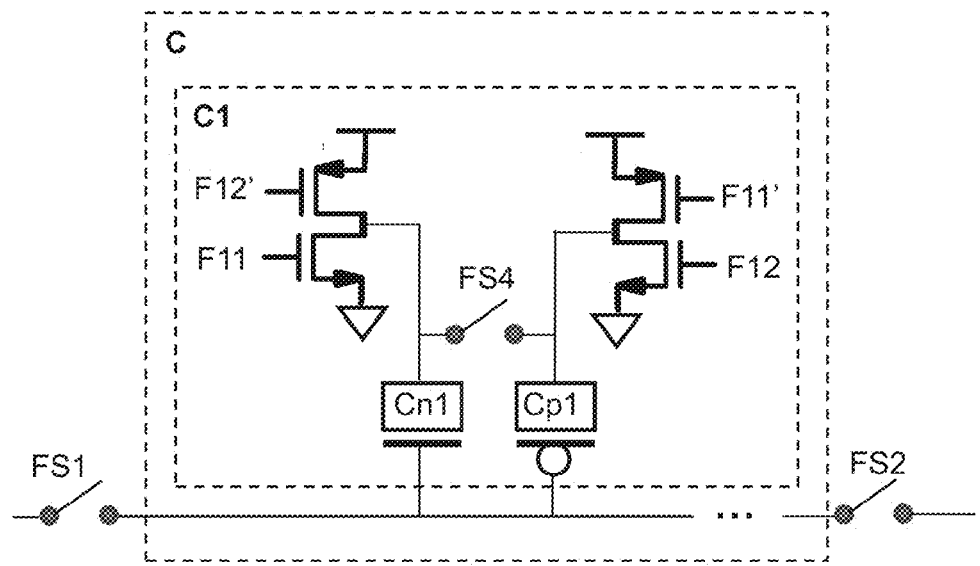
FIG. 5A is a schematic diagram of an example embodiment of a sample and hold circuit according to the present disclosure.
Figure 5B:
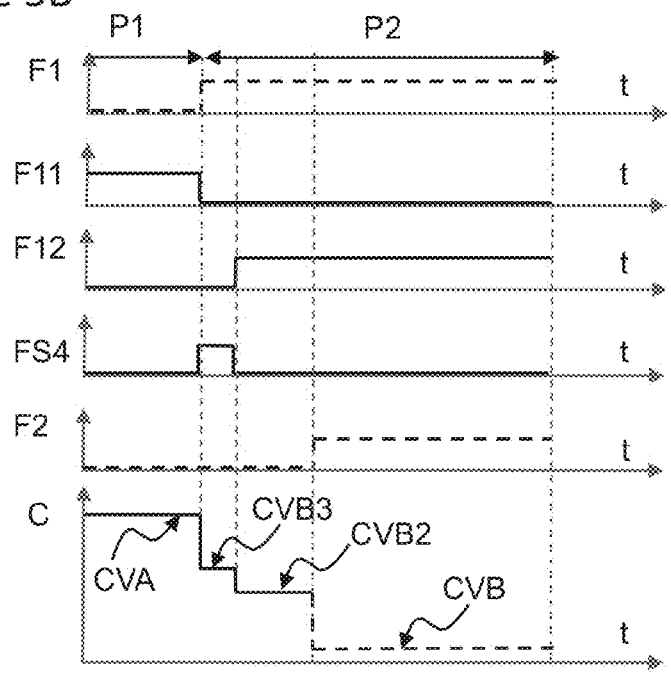
FIG. 5B illustrates a timing diagram corresponding to an example operation of the capacitive means of the sample and hold circuit of FIG. 5A.

According to another example embodiment of a sample and hold circuit 3 according to the disclosure, the first MOS capacitor pair C1 of FIG. 4A may be replaced by a MOS capacitor arrangement as shown in FIG. 5A, operated by MOS capacitor control signals F11, F11' and F12, F12' so that the effective capacitance values CVA, CVB3, CVB2, CVB can be dynamically changed during system operation, as is shown in FIG. 5B. MOS capacitor control signal F11' is the inverse of control signal F11 and MOS capacitor control signal F12' is the inverse of control signal F12.

In this case, according to an embodiment of the disclosure, when causing the first pair of MOS capacitors C1 to become biased from a high initial capacitance value to a final low capacitance value, the capacitance value transition is performed in a step-wise manner by briefly shorting the first NMOS Cn1 and a PMOS Cp1 capacitor drain/source nodes, with a switch FS4, in order to re-use the PMOS charge in the NMOS, before connecting them to Vdd or Gnd. Thereby, it is possible to limit the power consumption needed to switch the MOS capacitor bias and a power consumption reduction of up to 25% can be achieved.

It shall be understood that the above technique could be implemented also to operate the MOS capacitor pair of FIG. 2A, and that any combinations shown in the embodiments above and any number of voltage dependent capacitors can be implemented in the sample and hold circuit 3, to adapt the analogue-to-digital conversion to certain design requirements.

Figure 6:
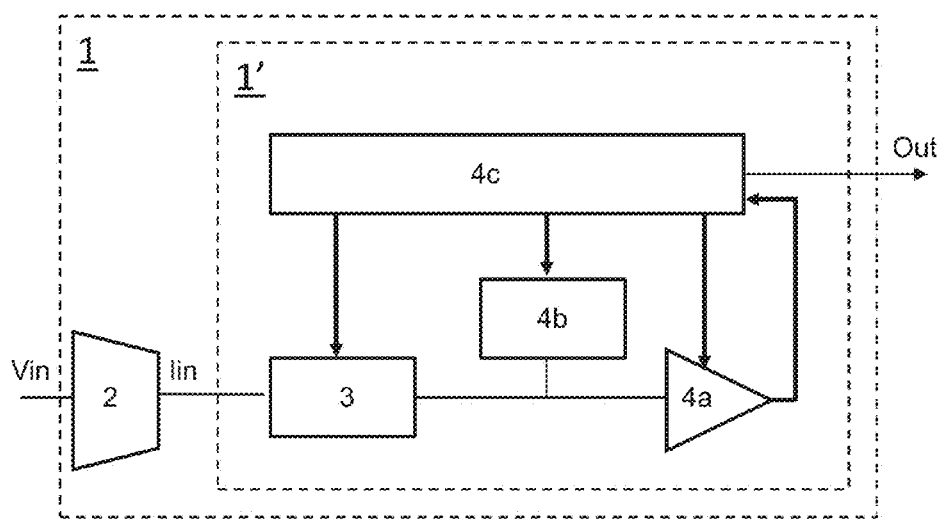
FIG. 6 shows a general block diagram of an example embodiment of a system for analogue-to-digital conversion according to the present disclosure.

FIG. 6 shows another block diagram of an example system 1 for converting an input analogue voltage signal Vin into an output N-bit digital signal Out, the system comprising an input interface circuit 2, a sample and hold circuit 3, a comparator 4a, a passive charge-sharing digital-to-analogue converter 4b, and an asynchronous SAR logic 4c.

According to an embodiment of the disclosure, the system 1 uses the charge that is linearly generated by integrating a V/I converter output current. In each of the steps of the successive approximation controller, the sign of the charge is determined by activating the comparator and a binary scaled reference charge is added to or subtracted from the total charge by passive charge sharing.

The system 1 and/or any individual circuits or devices 1' may be implemented in digital CMOS technology.

While the disclosure has been illustrated and described in detail in the drawings and foregoing description, such illustration and description are to be considered illustrative and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage.

What is claimed is:

1. A device comprising:
a sample and hold circuit configured to provide at least one signal related to an input analogue current signal by sampling the input analogue current signal and integrating it on capacitive means, thereby charging the capacitive means to a charge value, wherein the capacitive means is configured to dynamically change its effective capacitance value in order to shape a voltage signal present on the capacitive means by biasing the capacitive means, while the charge value on the capacitive means remains unchanged; and
an analogue-to digital conversion and control circuit configured to perform an analogue-to-digital conversion of the at least one related signal provided by the sample and hold circuit into an output digital signal, the analogue-to-digital conversion and control circuit including successive approximation analogue-to-digital conversion means for considering a value of the voltage signal on the capacitive means and converting the charge value present in the capacitive means into the digital output signal.

2. The device according claim 1, wherein the effective capacitance value of the capacitive means is biased to at least a first value during a first period in which the analogue current signal is being integrated in the sample and hold circuit and biased to at least a second value during a second period in which the charge value present in the capacitive means is being converted by the analogue-to-digital conversion and control circuit into the output digital signal, and wherein the first value is higher than the second value.

3. The device according to claim 2, wherein the capacitive means comprises at least two capacitors configured so that during the second period the first capacitor is biased from a high to a low capacitance value while a certain bit of the output digital signal is determined, and the second capacitor is biased from a high to a low capacitance value after the first capacitor has been configured to low capacity and when a subsequent bit of the output digital signal is determined.

4. The device according to claim 1, wherein the capacitive means is implemented using at least one voltage dependent capacitor.

5. The device according to claim 1, wherein the capacitive means is implemented using at least one PMOS and NMOS capacitor pair.

6. The device according to claim 5, wherein the at least one PMOS and NMOS capacitor pair is configurable to become biased from a high capacitance value to a low capacitance value, by shorting the NMOS and a PMOS capacitor drain/source nodes with a switch during a predetermined period of time.

7. An integrated circuit comprising a device for converting an input analogue current signal into an output digital signal, according to claim 1.

8. A system for converting an input analogue voltage signal into an output digital signal, comprising:
an input interface circuit for receiving the analogue voltage signal and including voltage-to-current conversion means for converting the analogue voltage signal into an analogue current signal; and
a device according to claim 1 for converting the analogue current signal into the output digital signal.

9. An integrated circuit comprising a system for converting an input analogue voltage signal into an output digital signal according to claim 8.

10. A method for converting an analogue current signal into a digital signal, comprising:
sampling and integrating the analogue current signal, during a first period, on dynamically configurable capacitive means;
providing a voltage signal on the capacitive means and a charge value stored in the capacitive means to a charge-domain analogue-to-digital converting means and converting the charge value into the digital output signal during a second period; and
dynamically changing the effective capacitance value of the capacitive means in order to shape a voltage signal present on the capacitive means by biasing the capacitive means, while the charge value on the capacitive means remains unchanged.

11. The method of claim 10, wherein dynamically changing the effective capacitance value of the capacitive means in order to shape a voltage signal present on the capacitive means further comprises setting the effective capacitance value of the capacitive means to at least a first value during the first period, and setting the effective capacitance value of the capacitive means to at least a second value during the second period, and wherein the first value is higher than the second value.

12. The method of claim 11, wherein dynamically changing the effective capacitance value of the capacitive means in order to shape a voltage signal present on the capacitive means further comprises, during the second period, setting the effective capacitance value of the capacitive means to at least a third value while a certain bit of the digital signal is determined, and setting, after the third value, the effective capacitance value of the capacitive means to the second value when a subsequent bit of the output digital signal is determined, and wherein the third value is between the first value and the second value.

13. The method of claim 12, wherein dynamically changing the effective capacitance value of the capacitive means in order to shape a voltage signal present on the capacitive means further comprises, before setting the third value and while the certain bit of the digital signal is determined, setting the effective capacitance value of the capacitive means to at least a fourth value, and wherein the fourth value is between the first value and the third value.

14. A method for converting an analogue voltage signal into a digital signal, comprising:
    converting the analogue voltage signal into an analogue current signal related to the analogue voltage signal; and
    converting the analogue current signal into the digital signal according to the method of claim 10.

* * * * *